(12) United States Patent
Lukens (10) Patent No.: US 12,339,214 B2
(45) Date of Patent: Jun. 24, 2025

(54) APPARATUS FOR AND METHOD OF MONITORING DROPLETS IN A DROPLET STREAM

(71) Applicant: ASML Netherlands B.V., Veldhoven (NL)

(72) Inventor: Joshua Mark Lukens, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 329 days.

(21) Appl. No.: 17/782,695

(22) PCT Filed: Nov. 18, 2020

(86) PCT No.: PCT/EP2020/082453
§ 371 (c)(1),
(2) Date: Jun. 6, 2022

(87) PCT Pub. No.: WO2021/121837
PCT Pub. Date: Jun. 24, 2021

(65) Prior Publication Data
US 2023/0028848 A1    Jan. 26, 2023

Related U.S. Application Data

(60) Provisional application No. 62/951,893, filed on Dec. 20, 2019.

(51) Int. Cl.
*G01N 15/10* (2024.01)
*G03F 7/00* (2006.01)
*H05G 2/00* (2006.01)

(52) U.S. Cl.
CPC ......... *G01N 15/10* (2013.01); *G03F 7/70033* (2013.01); *G03F 7/7055* (2013.01); *H05G 2/006* (2013.01)

(58) Field of Classification Search
CPC .... H05G 2/006; G01N 15/10; G03F 7/70033; G03F 7/7055
(Continued)

(56) References Cited

U.S. PATENT DOCUMENTS 7,372,056 B2    5/2008  Bykanov et al.
10,451,476 B2   10/2019 Chaggares et al.
(Continued)

FOREIGN PATENT DOCUMENTS

CN    103718654 A    4/2014
EP      2745648 A1   6/2014
(Continued)

OTHER PUBLICATIONS

International Search Report and Written Opinion, counterpart PCT Application No. PCT/EP2020/082453, mailed Feb. 10, 2021, 10 pages total.

*Primary Examiner* — Jacques M Saint Surin
(74) *Attorney, Agent, or Firm* — DiBerardino McGovern IP Group LLC (57) ABSTRACT

An apparatus for monitoring a stream of droplets of target material for generating a radiation beam in a radiation source, wherein the apparatus comprises: a target material emitter for creating the stream of droplets of target material, wherein the target material emitter comprises a chamber configured for the target material to pass through before forming the stream of droplets; a first transducer configured to generate acoustic pressures in the chamber, and a second transducer configured to sense the acoustic pressures in the chamber.

26 Claims, 5 Drawing Sheets

(58) Field of Classification Search
USPC .......................................................... 73/584
See application file for complete search history.

(56) References Cited

U.S. PATENT DOCUMENTS

| | | | |
|---|---|---|---|
| 11,680,922 B2 | 6/2023 | Effertz et al. | |
| 2002/0109437 A1 | 8/2002 | Sorg et al. | |
| 2006/0176925 A1 | 8/2006 | Nakano | |
| 2007/0001130 A1 | 1/2007 | Bykanov et al. | |
| 2008/0179549 A1 | 7/2008 | Bykanov et al. | |
| 2009/0014668 A1* | 1/2009 | Vaschenko | B82Y 10/00 |
| | | | 250/504 R |
| 2012/0228526 A1 | 9/2012 | Vaschenko | |
| 2013/0149434 A1 | 6/2013 | Oh et al. | |
| 2014/0160450 A1 | 6/2014 | Loopstra et al. | |
| 2015/0015863 A1 | 1/2015 | Kempen et al. | |
| 2017/0094764 A1* | 3/2017 | Masic | G03F 7/70033 |
| 2017/0332467 A1 | 11/2017 | Sanders et al. | |
| 2018/0281385 A1 | 10/2018 | Khalate | |
| 2018/0288863 A1 | 10/2018 | Fujimaki et al. | |
| 2019/0200443 A1 | 6/2019 | Nakano | |
| 2020/0404770 A1 | 12/2020 | Nakano | |

FOREIGN PATENT DOCUMENTS

| | | |
|---|---|---|
| JP | 2002334832 A | 11/2002 |
| JP | 2005079373 A | 3/2005 |
| JP | 2006216801 A | 8/2006 |
| JP | 2013121908 A | 6/2013 |
| JP | 2014529840 A | 11/2014 |
| JP | 2018534800 A | 11/2018 |
| WO | 2013020758 A1 | 2/2013 |
| WO | 2018069976 | 4/2018 |
| WO | 2018103975 A1 | 6/2018 |
| WO | 2019137846 A1 | 7/2019 |
| WO | 2019185370 A1 | 10/2019 |
| WO | 2019207768 A1 | 10/2019 |

* cited by examiner

APPARATUS FOR AND METHOD OF MONITORING DROPLETS IN A DROPLET STREAM

CROSS-REFERENCE TO RELATED APPLICATIONS

This application claims priority of U.S. application 62/951,893, which was filed on 20 Dec. 2019 and titled APPARATUS FOR AND METHOD OF MONITORING DROPLETS IN A DROPLET STREAM, which is incorporated herein in its entirety by reference.

FIELD

The present invention relates to an apparatus for creating, monitoring and controlling a stream of droplets of target material for generating a radiation beam in a radiation source. More particularly, the radiation source is an extreme ultraviolet (EUV) radiation source, which produces EUV radiation from the target material.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Methods to produce EUV light include, but are not necessarily limited to, converting a source material into a plasma state that has a chemical element with an emission line in the EUV range. These elements can include, but are not necessarily limited to, xenon, lithium and tin.

In one such method, often termed laser produced plasma ("LPP"), the desired plasma can be produced by irradiating a source material, for example, in the form of a droplet, stream or wire, with a laser beam. In another method, often termed discharge produced plasma ("DPP"), the required plasma can be generated by positioning source material having an appropriate emission line between a pair of electrodes and causing an electrical discharge to occur between the electrodes.

One technique for generating droplets involves melting a target material such as tin and then forcing it under high pressure through a relatively small diameter orifice, such as an orifice having a diameter of about 0.5 µm to about 30 µm, to produce a stream of droplets having droplet velocities in the range of about 30 m/s to about 150 m/s. Under most conditions, in a process called Rayleigh breakup, naturally occurring instabilities, e.g. noise, in the stream exiting the orifice, will cause the stream to break up into droplets. These droplets may have varying velocities and may combine with each other to coalesce into larger droplets.

In the EUV generation processes under consideration here, it is desirable to control the break-up and coalescence processes. For example, in order to synchronize the droplets with the optical pulses of an LPP drive laser, a repetitive disturbance with an amplitude exceeding that of the random noise may be applied to the continuous stream. By applying a disturbance at the same frequency (or its higher harmonics) as the repetition rate of the pulsed laser, the droplets can be synchronized with the laser pulses. For example, the disturbance may be applied to the stream by coupling an electro-actuatable element (such as a piezoelectric material) to the stream and driving the electro-actuatable element with a periodic waveform. In one embodiment, the electro-actuatable element will contract and expand in diameter (on the order of nanometers). This change in dimension is mechanically coupled to a capillary that undergoes a corresponding contraction and expansion of diameter. The column of target material, e.g., molten tin, inside the capillary also contracts and expands in diameter (and expands and contracts in length) to induce a velocity perturbation in the stream at the nozzle exit.

As used herein, the term "electro-actuatable element" and its derivatives, means a material or structure which undergoes a dimensional change when subjected to a voltage, electric field, magnetic field, or combinations thereof and includes, but is not limited to, piezoelectric materials, electrostrictive materials and magnetostrictive materials.

In addition to the droplets being synchronized with the laser pulses, the droplets may also be coalesced into droplets larger than those initially created during breakup of the stream. The coalescence may be effected under conditions that permit control of the coalescence process.

Apparatus for and methods of using an electro-actuatable element to control a droplet stream and coalescence of a droplet stream are disclosed, for example, in International Patent Application Publication No. WO 2019/137846 A1, titled "Apparatus for and method of controlling coalescence of droplets in a droplet stream" and published 18 Jul. 2019, which is hereby incorporated by reference in its entirety.

It is desirable to monitor and control droplet generation and coalescence that overcomes or mitigates one or more problems associated with the prior art.

SUMMARY OF INVENTION

In one embodiment, an apparatus for monitoring a stream of droplets of target material for generating a radiation beam in a radiation source comprises: a target material emitter configured to create the stream of droplets of target material to pass through wherein the target material emitter comprises a chamber configured for the target material to pass through; a first transducer configured to generate acoustic pressures in the chamber, and a second transducer configured to sense the acoustic pressures in the chamber.

In another embodiment, a lithographic system comprising a radiation source and an apparatus for monitoring a stream of droplets of target material for generating a radiation beam in the radiation source comprises: a target material emitter configured to create the stream of droplets of target material, wherein the target material emitter comprises a chamber configured for the target material to pass though; a first transducer configured to generate acoustic pressures in the chamber' and a second transducer configured to sense the acoustic pressures in the chamber.

In another embodiment, a method of monitoring a stream of droplets of target material for generating a radiation beam in a radiation source comprises: passing the target material through a chamber of a target material emitter before forming the stream of droplets, generating acoustic pressures in the chamber using an first transducer, and sensing the acoustic pressures in the chamber using a second transducer.

In yet another embodiment, an apparatus for monitoring a stream of droplets of target material for generating a radiation beam in a radiation source comprises: a target material emitter configured to create the stream of droplets of target material, wherein the target material emitter comprises a chamber configured for the target material to pass through before forming the stream of droplets, and a transducer; wherein the transducer comprises transducer material and a plurality of electrodes on the transducer material such that the transducer is configured to generate and sense the acoustic pressures in the chamber.

BRIEF DESCRIPTION OF THE DRAWINGS

Embodiments of the invention will now be described, by way of example only, with reference to the accompanying schematic drawings, in which.

DETAILED DESCRIPTION

Figure 1:
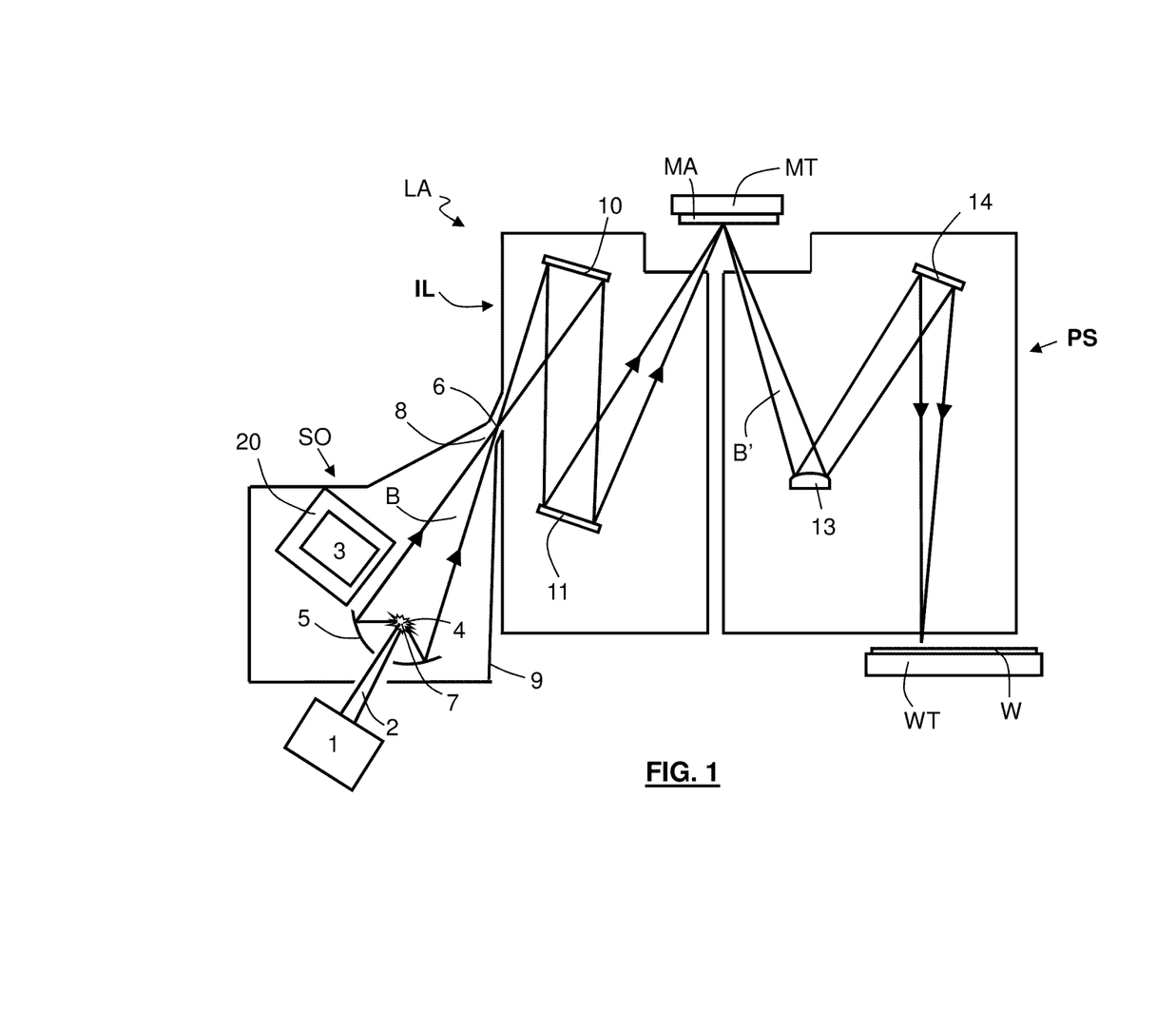
FIG. 1 depicts a lithographic system comprising a lithographic apparatus and a radiation source in accordance with an embodiment of the invention.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a target material, such as tin (Sn) which is provided from, e.g., a target material emitter 3. Although tin is referred to in the following description, any suitable target material (sometimes referred to as a "fuel") may be used. The target material may, for example, be in liquid form, and may, for example, be a metal or alloy. The target material emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

An apparatus 20 is provided for monitoring a stream of droplets of target material created by the target material emitter 3. The tin (target material) ejected from the target material emitter 3 coalesces into droplets (not shown) before arriving at the plasma formation region 4 where the tin droplets are used to generate the EUV radiation beam B.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Figure 2:
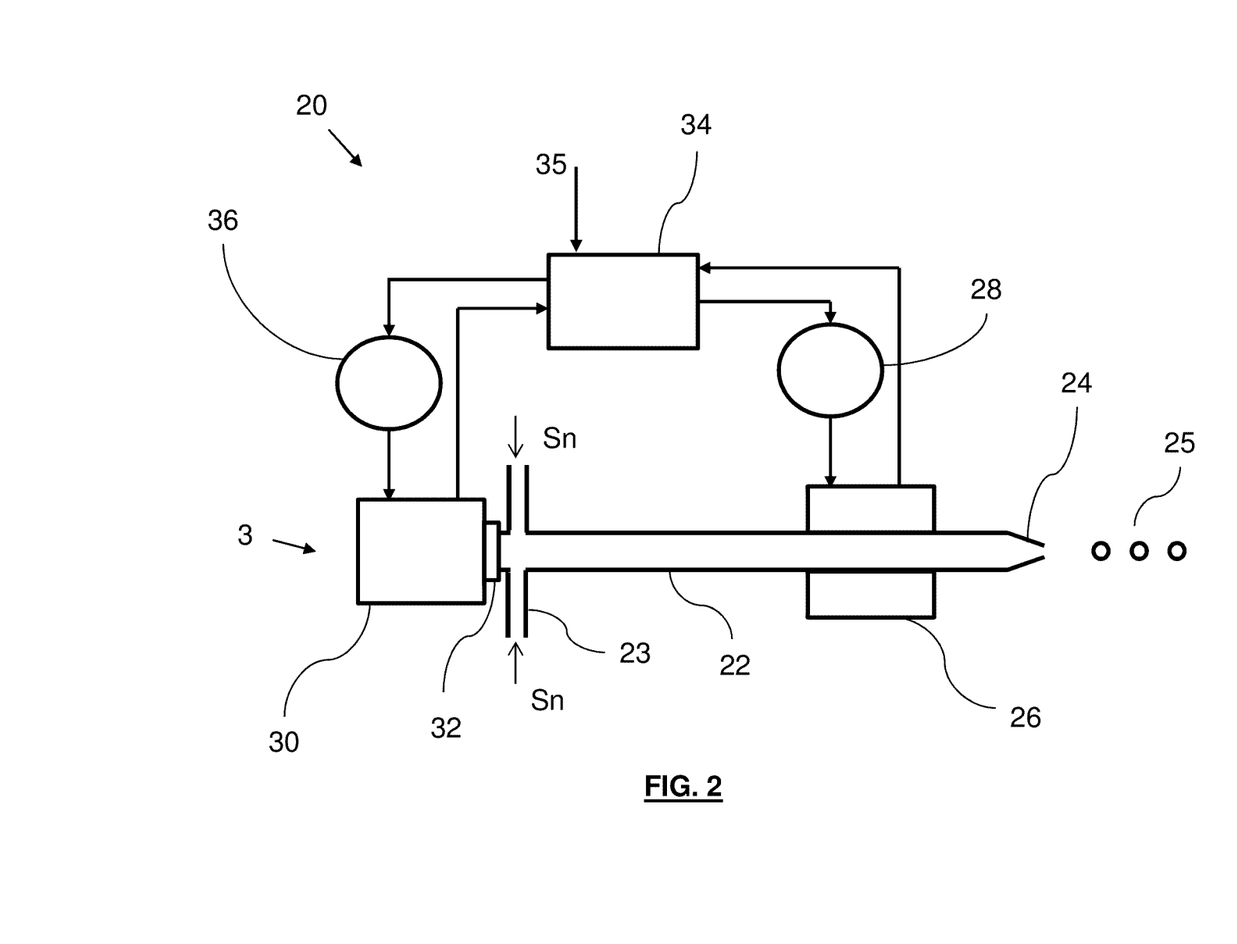
FIG. 2 depicts a schematic diagram of an apparatus for monitoring a stream of droplets of target material in accordance with an embodiment of the invention.

FIG. 2 shows the target material emitter 3 and the apparatus 20 in more detail in a simplified schematic form. The target material emitter 3 creates a stream of droplets of target material (e.g. tin (Sn)) for generating an EUV radiation beam B in the radiation source SO. The target material emitter 3 is described as forming part of the apparatus 20 but it will be appreciated that the apparatus 20 may be considered to be a separate system from the target material emitter 3.

As shown, the target material emitter 3 may include a chamber (e.g. a capillary 22) holding a fluid (or target material), e.g. molten tin, under pressure. The capillary 22 may have one or more inlet ports 23 through which the fluid may be introduced into the capillary. Also shown, the capillary 22 may be formed with a nozzle 24 allowing the pressurized target material to flow through the nozzle 24 establishing a continuous stream (not shown) which subsequently breaks into droplets 25. The nozzle 24 may be configured to direct tin, e.g. in the form of droplets, along a trajectory towards the plasma formation region (not shown).

The capillary 22 may have a mechanical resonance at a particular frequency, e.g. 50 kHz. This resonance can allow relatively higher amplitude standing waves to be set up in the capillary 22 and can help conserve energy within the capillary 22.

The target material emitter 3 may include a reservoir (not shown) holding the target material, e.g. molten tin, under pressure. The reservoir may be connected to the capillary 22 near an end of the capillary 22 (entrance end) opposite an end where the nozzle 24 is located (i.e. the reservoir is near the end at the left side of the capillary 22 as shown in FIG. 2). This allows the pressurized target material to flow through the capillary 22 and out an orifice in the nozzle 24. This may establish a continuous stream which subsequently breaks into a plurality of droplets.

The apparatus 20 shown further includes a sub-system producing a disturbance in the target material having a first transducer 26 that is operably coupled with the target material and a first signal generator 28 driving the first transducer 26. The first transducer 26 is configured to generate acoustic pressures in the capillary 22. That is, the first transducer 26 is an electro-actuatable element. More particularly, the electro-actuatable element may be a piezoelectric element but, in other embodiments, it will be appreciated that the electro-actuatable element may be made of a different material, such as electrostrictive materials or magnetostrictive materials. For example, the piezoelectric elements may measure up to 10 MHz and the acoustic frequencies of interest may be in the region of 2 MHz and 500 kHz.

The first transducer 26 is configured coaxially with the capillary 22. The first transducer 26 may have a ring shape or cylindrical tube shape. The first transducer 26 may be located at least partially, or fully, around the capillary 22. That is, positioned to surround a circumference of the capillary 22.

The first transducer 26 has a degree of freedom aligned radially with the capillary 22. The first transducer 26 is configured to transmit oscillations to the target material by oscillating a longitudinal wall (i.e. a wall that extends longitudinally in the direction of the capillary 22 axis) of the capillary 22. Oscillations from the first transducer 26 to the target material are transmitted by oscillating the longitudinal wall of the capillary 22, i.e. the longitudinal wall of the capillary 22 oscillates due to the oscillations of the first transducer 26. The first transducer 26 contracts radially and squeezes the capillary 22 radially which, in turn, disturbs the target material in the capillary 22. This induces velocity perturbations in the target material based on an amplitude of a control signal from the first signal generator 28. That is, an acoustic pressure is generated in the capillary 22 by the first transducer 26. This occurs through the first transducer 26 being mechanically coupled to the target material in the capillary 22.

Waveforms having different waveform amplitude, periodic frequency and/or waveform shape may be used to drive the first transducer 26 to produce target material droplets for EUV output. The first transducer 26 produces a disturbance in the target material which generates droplets having differing initial velocities causing at least some adjacent droplet pairs to coalesce together prior to reaching the irradiation region. The ratio of initial droplets to coalesced droplets may be two, three or more and in some cases tens, hundreds, or more.

Control of the breakup/coalescence process thus involves controlling the droplets such that they coalesce sufficiently before reaching the irradiation region and that arrive with a timing corresponding to the pulse rate of the laser being used to irradiate the coalesced droplets. In some embodiments, a hybrid waveform made up of multiple superposed voltage waveforms is supplied to the first transducer 26 to control the coalescence process of Rayleigh breakup micro droplets into fully coalesced droplets of a frequency corresponding to the laser pulse rate. The waveform may be defined as a voltage or current signal.

The first transducer 26 on the capillary 22 may be used to generate a standing acoustic wave in the high pressure system (of the capillary 22) to generate droplets of a specific size, frequency, and velocity.

Also part of the sub-system of the apparatus 20 is a second transducer 30 operably coupled with the target material in the capillary 22. The second transducer 30 is configured to sense acoustic pressures in the capillary 22. This occurs through the second transducer 30 being mechanically coupled to the target material in the capillary 22. The second transducer 30 is an electro-sensor element. More particularly, the electro-sensor element may be a piezoelectric element but, in other embodiments, it will be appreciated that the electro-sensor element may be made of a different material, such as electrostrictive materials or magnetostrictive materials.

In this embodiment, the first transducer 26 and the second transducer 30 are independent (i.e. they are separate from each other and controlled/monitored separately). Although the first transducer 26 and the second transducer 30 have been described as forming part of a sub-system of the apparatus 20, it will be appreciated that they may also be considered to form part of the target material emitter 3 itself.

The second transducer 30 may be a stacked piezoelectric element. The second transducer 30 is located near the entrance end of the capillary 22, where the target material enters the capillary 22 (i.e., opposite the nozzle 24 end). The second transducer 30 is configured linearly with respect to the capillary 22 with a degree of freedom aligned with a longitudinal axis of the capillary 22. That is, the first transducer 26 and the second transducer 30 are orientated with substantially orthogonal degrees of freedom.

A flexible membrane 32 is located near the entrance end of the capillary 22 (i.e. near an end wall of the capillary 22). In various implementations, the membrane is formed of molybdenum or other material that is suitable for use in contact with molten tin. Oscillations from the target material to the second transducer 30 are transmitted by oscillating the end wall of the capillary 22, i.e. the end wall of the capillary 22 oscillates due to the acoustic pressure waves in the target material. More particularly, the flexible membrane 32 is configured to transmit oscillation from the target material to the second transducer 30 (by the flexible membrane 32 oscillating). The acoustic pressure generated by the first transducer 26 is transmitted through the target material and causes a force on the flexible membrane 32. Thus, a forced acoustic displacement is caused on the second transducer 30. The flexible membrane 32 is compliant and moves easier than a fixed wall so the oscillations are transmitted to the second transducer 30 more effectively.

The second transducer 30 is connected to a control unit 34 and electrical signals from the second transducer 30 are transmitted to the control unit 34 (as shown by the arrows) for processing. The control unit 34 may have an input signal 35. The mechanical stress on the second transducer 30 is converted into the electrical signals. The acoustic pressures in the capillary 22 generated by the first transducer 26 may be sensed by the apparatus 20 by measuring the voltage feedback (e.g. at the control unit 34) caused by the forced acoustic displacement of the second transducer 30.

The control unit 34 may process the electrical signals from the second transducer 30 and thus determine the pressure wave frequency, phase, and amplitude, thus enabling measurement of conditions within capillary 22. From this, it is possible to sense and control the coalescence process without using external optical metrology feedback (e.g. that images the tin jet or droplet formation process). The control can be applied by modifying the signals applied by the first transducer 26 (and in various implementations, by the second transducer 30, as discussed below).

The second transducer 30 (e.g. the piezoelectric element) sensing degree of freedom is aligned to the capillary axis and provides a direct measure of acoustic pressure amplitude, phase, and frequency content. The second transducer 30 enables the acquisition of real-time information of conditions within the capillary tube. This information may be used instead of, or in addition to, measurements of the timing, speed, or coalescence of droplets that exit nozzle 24. The first transducer 26 (i.e. the coaxial piezoelectric element) is capable of providing large dynamic pressures directly to the acoustic capillary 22. In various implementations, the two transducers 26, 30 working in concert can actively monitor and control for the desired acoustic pressures needed for droplet modulation.

The apparatus 20 (i.e. active control system) monitors system acoustics in the two degrees of freedom most relevant to droplet modulation. This setup is capable of balancing large displaced area-induced delta pressures provided by the coaxial piezoelectric element (first transducer 26) with the limited displaced area associated with the membrane 32 and piezoelectric element stack (second transducer 30).

A waveform (e.g., the hybrid waveform) may be provided to the first transducer 26 from the first signal generator 28 based on control signals from the control unit 34. These control signals may be based on the feedback from the second transducer 30 sensing the acoustic pressures in the capillary 22 from the first transducer 26. The control signals may also be based on the input signal 35.

In use, the input signal 35 may be sent to the control unit 34 (e.g. based on the desired size, frequency and/or velocity of the droplets) and the control unit 34 may provide control signals to the first signal generator 28 to generate the waveforms. The first signal generator 28 may provide the electrical signals to the first transducer 26 to generate the acoustic pressures in the capillary 22 to produce the desired droplets. The second transducer 30 may sense the acoustic pressures generated by the first transducer 26 in the capillary 22 and the electrical signals produced by the second transducer 30 may be transmitted to the control unit 34.

The control unit 34 may process the signals from the second transducer 30 (e.g. by using an algorithm) and ascertain the droplets (e.g. size, velocity, frequency) that are being formed (e.g. at or near the plasma formation region). This may be by comparing the electric signals from the second transducer 26 with expected acoustic pressures in the capillary 22. Also, comparisons of the electric signals from the second transducer may be compared with a lookup table that records droplet properties (speed, timing, coalescence lengths) that were measured during an initial calibration procedure. The control unit 34 may then modify the control signals to the first signal generator 28 accordingly to control the coalescence etc. of the droplets.

In other implementations, control signals may be sent from the control unit 34 to a second signal generator 36 to generate acoustic pressures in the capillary 22 from the second transducer 30, which may then be sensed by the first transducer 26 and fed back to the control unit 34. The electrical signals from the first transducer 26 may also be processed by the control unit 34 (e.g. fed into an algorithm) and also used to modify the control signals being used to generate the acoustic pressures in the capillary 22. Thus, a feedback loop is set up. Thus, the control unit 34 may (continually) actively monitor and actively control the droplet creation and coalescence process.

The apparatus 20 provides the ability to provide inline measurement and inline control of the capillary 22 acoustic pressure in the time and frequency domain, supporting active control of the droplet generation process.

To control the acoustic pressure waves in the capillary 22, and thus control droplet formation and coalescence, at least one electro-actuator element (first transducer 26) and at least one electro-sensor element (second transducer 30) may be required.

However, a configuration where one or both of the first transducer 26 and the second transducer 30 are both actuating and sensing is also contemplated.

In this embodiment, the first transducer 26 is also configured to sense acoustic pressures in the capillary 22. The first transducer 26 is also connected to the control unit 34 and the electrical signals from the first transducer 26 are transmitted to the control unit 34 (as shown by the arrows) for processing. Oscillations from the target material to the first transducer 26 are transmitted by oscillating the longitudinal wall of the capillary 22.

The second transducer 30 is also configured to generate acoustic pressures in the capillary 22 by being driven by the second signal generator 36. The acoustic pressure generated by the second transducer 30 is transmitted through the target material and causes a force on the longitudinal wall of the capillary 22. Thus, a forced acoustic displacement is caused on the first transducer 26 as well. In other embodiments, the first transducer 26 and the second transducer 30 may be driven by the same signal generator.

Thus, the first transducer 26 and the second transducer 30 may both be configured for both sensing and actuating. The first transducer 26 and the second transducer 30 may both be considered to comprise both an electro-actuatable element and an electro-sensor element.

This configuration is often referenced as Multiple Input Multiple Output (MIMO). Using both first and second transducers 26, 30, in a MIMO configuration (and with an advanced control algorithm) may give better control as they will take advantage of favourable spatial locations relative to the acoustic wavelengths that is a function of frequency.

Although the first transducer 26 and the second transducer 30 are described as being for both actuating and sensing, it will be appreciated that in other embodiments, the first transducer 26 may be configured for only actuating and the second transducer 30 may be configured for only sensing, or vice versa.

Using the principle of reciprocity, it is possible to determine the delta acoustic pressure actuating capability of each sensor (i.e. first and second transducers 26, 30) in the frequency domain and work in concert to actively control acoustic pressure waves.

Preferably, at least one actuating transducer is located near the nozzle 24 end of the capillary 22. It is preferred to have at least one actuating transducer 26, 30 within less than ⅔rds of the length of the capillary 22 from the nozzle 24 end of the capillary 24.

Alternative systems may include a droplet position detection system with one or more droplet imagers that provide an output indicative of the position of one or more droplets, e.g., relative to an irradiation region. The imager(s) may provide this output to a droplet position detection feedback system, which may, e.g., compute a droplet position and trajectory, from which a droplet error may be computed, e.g., on a droplet-by-droplet basis, or on average. The droplet error may then be provided as an input to a controller, which may, for example, provide a position, direction and/or timing correction signal to a system to control laser trigger timing and/or to control movement of optics in the beam conditioning unit, e.g., to change the location and/or focal power of the light pulses being delivered to the irradiation region in a chamber. Also for the EUV light source, a source material delivery system may have a control system operable in response to a signal (which in some implementations may include the droplet error described above, or some quantity derived therefrom) from the controller, to e.g., modify the release point, initial droplet stream direction, droplet release timing and/or droplet modulation to correct for errors in the droplets arriving at the desired irradiation region.

However, such an alternative arrangement may require one or more imagers (i.e. external imaging metrology) to monitor the droplets after they form upon exit from the source material delivery system. That is, the droplet coalescence process could only be controlled after receiving feedback from images of actual coalesced droplets, i.e. not in real time. This alternative arrangement introduces a challenge in that there is not a way to measure the amplitude of the acoustic wave in the frequency domain and its impact on the tin target droplet formation process without external metrology that images the tin jet or droplet formation process.

In embodiments, the apparatus 20 including the target material emitter 3 can explicitly control the droplet coalescence process in the time and frequency domain without the need for external imaging metrology. Thus, active droplet coalescence control may be achieved using the apparatus 20. The apparatus 20 allows the inline measurement of dynamic pressures required for the EUV tin target droplet formation process, rather than relying on inferences from the observed timing and velocity of droplets that exit the apparatus. Furthermore, the apparatus 20 enables algorithm development for optimal droplet coalescence where droplets are formed from a tin jet with varying velocity in a capillary system.

The apparatus 20 influences the momentum or velocity of the stream of target material leaving the target material emitter 3, which is translated to the droplet breakup and coalescence process. The apparatus 20 also allows the waveform that influences the momentum or velocity to be adjusted and optimised to produce the desired size of droplets at the desired location to produce the EUV radiation beam B. This may be carried out in real time and so provides an advantage of a reduction in latency. There would be a lag time for results using external (imaging) metrology as this only provides results after the droplets have been formed and not results based on measurements of conditions in the capillary (i.e. the acoustic pressures in the capillary).

Furthermore, the piezoelectric elements (or other materials) may change over time (i.e. their effects may change after hours, days, or months of operation) and the apparatus 20 allows monitoring to be carried out to see what this change is (and its effects).

Figure 3:
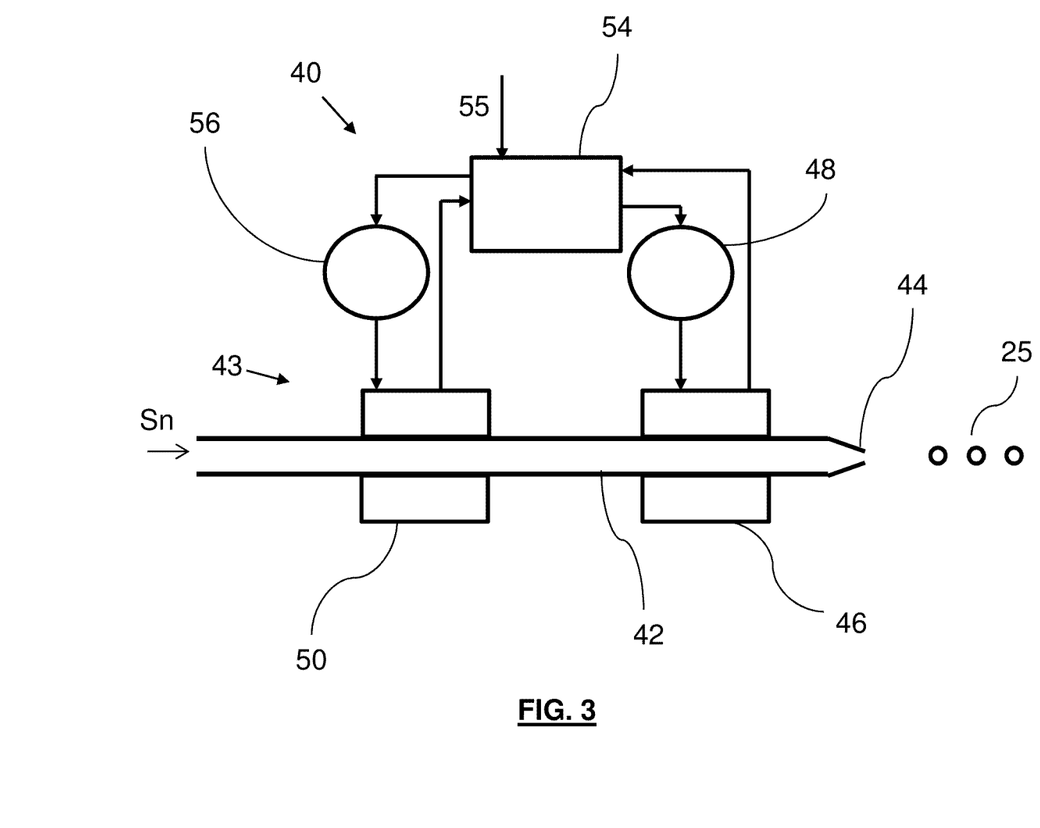
FIG. 3 depicts a schematic diagram of an apparatus for monitoring a stream of droplets of target material in accordance with an embodiment of the invention.

FIG. 3 depicts a further embodiment of an apparatus 40 for monitoring a stream of droplets of target material created by a target material emitter 43. The apparatus 40 is similar to the apparatus 20 shown in FIG. 2 except the second transducer is different, as will be explained.

The apparatus 40 and the target material emitter 43 function in a similar manner to the apparatus 20 and target material emitter 3 shown in FIG. 2. That is, the target material emitter 43 creates a stream of droplets of target material (e.g. tin (Sn)) for generating an EUV radiation beam B in the radiation source SO.

As shown, the target material emitter 43 includes a reservoir (not shown), a capillary 42 holding a target material under pressure, and a nozzle 44 to produce the continuous stream which subsequently breaks up into droplets.

The apparatus 40 has a coaxial first transducer 46 that is substantially the same as in FIG. 2, i.e. generates and senses acoustic pressure waves in the target material in the capillary 42.

The apparatus 40 also has a second transducer 50 that is configured coaxially with the capillary 42. The second transducer 50 may have a ring shape or cylindrical tube shape. The second transducer 50 may be located at least partially, or fully, around the capillary 42. That is, positioned to surround a circumference of the capillary 42. The second transducer 50 may thus be similar to the first transducer 46.

The second transducer 50 has a degree of freedom aligned radially with the capillary 42. The second transducer 50 is configured to sense the acoustic pressures in the capillary 42. The acoustic pressures are sensed by measuring the voltage feedback caused by the forced acoustic displacement of the second transducer 50. Oscillations from the target material to the second transducer 50 are transmitted by oscillating a longitudinal wall (i.e. a wall that extends longitudinally in the direction of the capillary 42 axis) of the capillary 42.

In embodiments, the first transducer 46 and/or the second transducer 50 may be configured to both sense and generate acoustic pressures in the capillary 42 in a similar way to as described with respect to FIG. 2.

The apparatus 40 has first and second signal generators 48, 56 and a control unit 54 which function in a similar way to the embodiment of FIG. 2. Thus, active droplet coalescence control may be achieved using the apparatus 40. The control unit 54 may have an input signal 55. It will be appreciated that in other embodiments, a different number of signal generators (e.g. only one) and control units may be used.

An advantage of using a coaxial second transducer over using a stacked linear second transducer may be that the apparatus may be easier to manufacture. In addition, there is more surface area in contact with the capillary, i.e. more surface to impact and be impacted by the capillary. That is, more energy can be imparted into the capillary by the coaxial second transducer compared with the linear second transducer.

An advantage with using a stacked linear second transducer over using a coaxial transducer is that it may be better able to measure the acoustic pressure in the capillary. There may be areas in the capillary where the acoustic pressure amplitude is not high enough to be detected by the coaxial second transducer on the capillary.

Use of the apparatus 40 also permits nozzle transfer function determinations of the on-axis target material stream velocity perturbations/profile which in turn can be used to optimize the parameters of the waveform(s) driving the first transducer 26.

The nozzle transfer function may be defined as the velocity perturbation that is obtained at the nozzle exit per unit applied voltage at a specific frequency. For the considered nozzle transfer function, the signal applied to the first transducer 46 (characterized by frequency, magnitude, and/or phase) is the input, while the velocity perturbation as imposed on the liquid jet is the output. As an example, coalescence length may, in various regimes, vary monotonically with the amplitude of the sine component of a hybrid waveform. Larger sine amplitude implies an increased velocity perturbation, hence coalescence length decreases.

The transfer function can be used to assess the condition of the target material emitter 43. For example, a change in the transfer function could be used as an indication that the target material emitter 43 requires maintenance or is reaching the end of its useful life.

Figure 4:
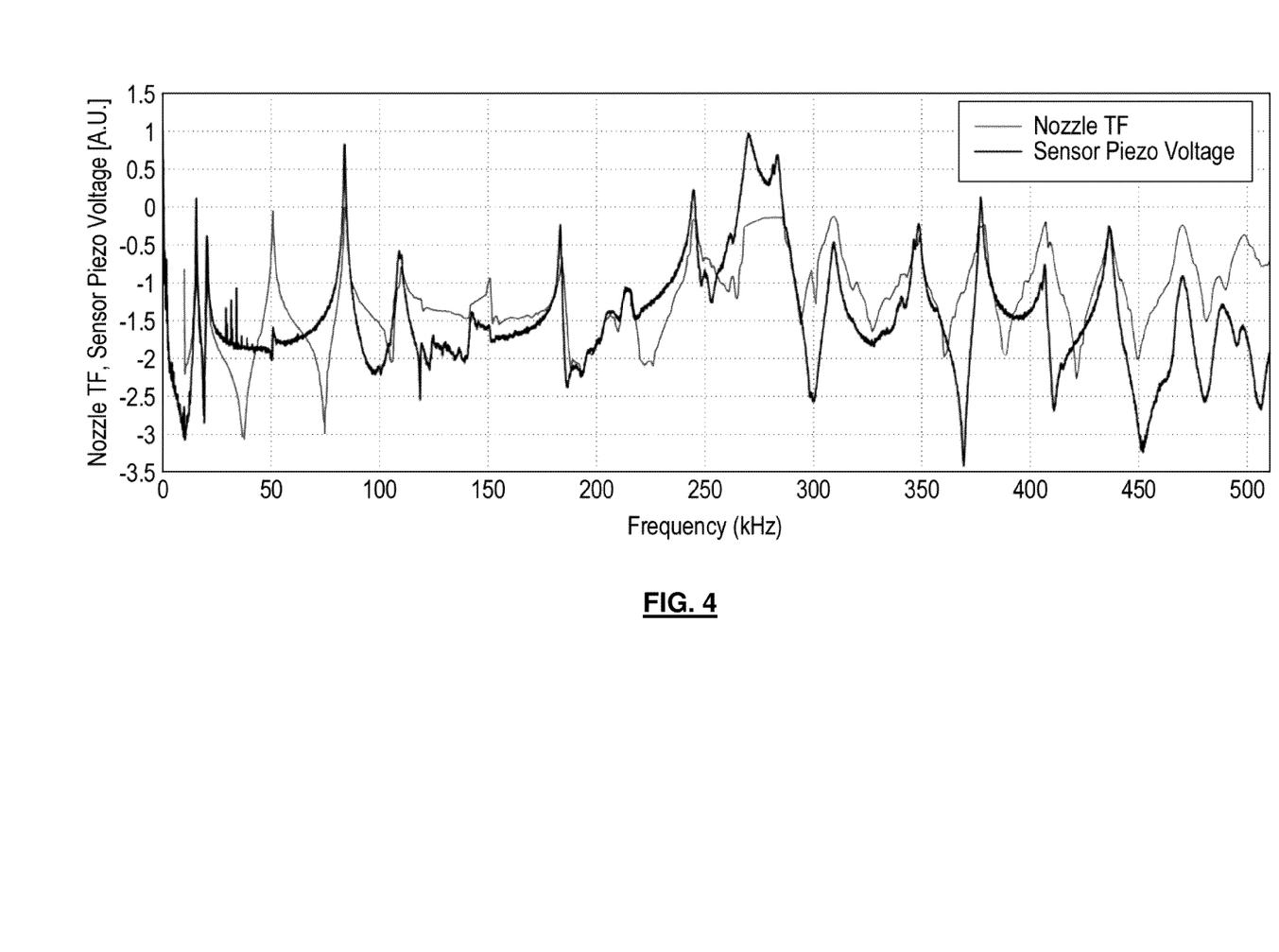
FIG. 4 depicts a graph of a comparison between velocity jet transfer function and electro-sensor transducer voltage in accordance with an embodiment of the invention.

FIG. 4 shows a graph showing a comparison between velocity jet transfer function (Nozzle TF, thin lines) and the second transducer 50 voltage (Sensor Piezo Voltage, thick lines). The nozzle TF and the sensor piezo voltage are shown on the y-axis and the frequency in kHz (from 0 to approx. 500 kHz) is shown on the x-axis. It can be seen that the nozzle transfer function is related to or partially or substantially matches the electro-sensor element voltage (in this case piezo sensor voltage). Thus, knowing the piezo sensor voltage means that the nozzle TF can be estimated (or calculated) and thus fed back into the control unit.

Figure 5:
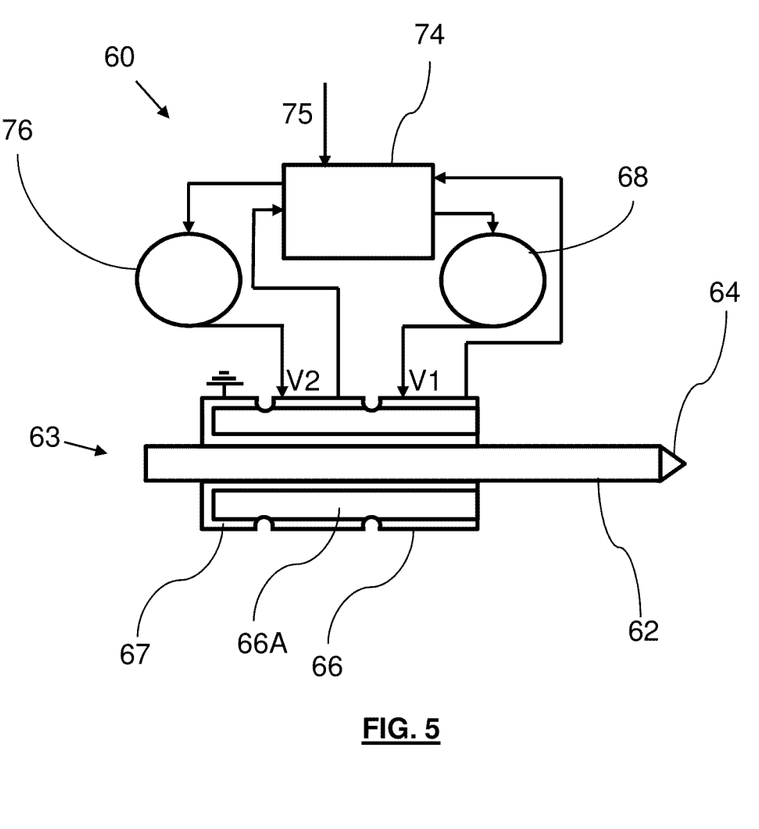
FIG. 5 depicts a schematic diagram of an apparatus for monitoring a stream of droplets of target material in accordance with an embodiment of the invention.

FIG. 5 depicts a further embodiment of an apparatus 60 for monitoring a stream of droplets of target material created by a target material emitter 63. The apparatus 60 is similar to the apparatus 40 shown in FIG. 3 except there is only a single transducer unit. The apparatus 60 has the same or similar components as in apparatus 40 and are labelled with referenced numerals increased by 20 as shown. For conciseness they are not repeated here but it will be appreciated that they function in a similar manner unless specifically mentioned.

As mentioned, in the apparatus 60 there is only a single transducer unit 66. However, there is a conductive layer 67 (coating) around transducer material 66A which is separated by semi-circular cut-outs (or notches) into separated conductors (or separate conductive areas—i.e. electrodes.) The conductive layer 67 allows application of a voltage to the surface of the transducer material (i.e. piezoelectric element). In embodiments, the transducer material 66A may be located around the capillary 62 and the electrodes (conductive areas) may be formed by circumferential notches in the conductive layer 67. The transducer unit 66 is provided with one voltage V1 to a first conductive area of the transducer unit 66 nearest a nozzle 64 and a second voltage V2 to a second conductive area of the transducer unit 66 further away from the nozzle 64. There is a third conductive area of the transducer unit 66 furthest away from the nozzle 64 that is connected to ground as shown. The transducer unit 66 can thus be operated as two independent or partially-independent transducers, applying voltages V1 and V2 to the separated conductive areas. It will be appreciated that, in other embodiments, the apparatus could have more than one transducer unit.

The conductive areas in the transducer unit 66 mentioned are separated (see semi-circular cut-outs in the transducer unit 66. This means that the waveform (V1) can be provided to the first conductive area of the transducer unit 66 to generate the acoustic pressures in a capillary 62 and the acoustic pressures can be sensed by the second conductive area of the transducer unit 66. Likewise, a different waveform (V2) can be provided to the second conductive area of the transducer unit 66 to generate the acoustic pressures in the capillary 62 and the acoustic pressures can be sensed by the first conductive area of the transducer unit 66. The acoustic pressures can thus be monitored and controlled by a control unit 74 and signal generators 68, 76 in a similar manner to as described above with respect to the other embodiments. Thus, active droplet coalescence control may be achieved using the apparatus 60. The control unit may have an input signal 75. Furthermore, the functionality of apparatus 60 may be integrated into transducers (e.g. piezoelectric elements) presently used in the radiation source (i.e. in or on target material emitters).

FIG. 5 shows the transducer unit 66 effectively operating as two independent actuators (actuated by V1 and V2). These actuators may serve double duty as sensors (for a MIMO analysis of the structure). It will be appreciated that adding more notches, thus providing more electrodes, can extend to 3 or 4 or more independent actuators.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. Additional aspects of the invention are set out in the following numbered examples.

Example A1. An apparatus for monitoring a stream of droplets of target material for generating a radiation beam in a radiation source, wherein the apparatus comprises:
 a target material emitter configured to create the stream of droplets of target material,
 wherein the target material emitter comprises a chamber configured for the target material to pass through;
 a first transducer configured to generate acoustic pressures in the chamber, and
 a second transducer configured to sense the acoustic pressures in the chamber.

Example A2. The apparatus of example A1, wherein the apparatus is configured to sense the acoustic pressures by measuring the voltage feedback caused by the forced acoustic displacement of the second transducer.

Example A3. The apparatus of any preceding example, wherein the first transducer is configured coaxially with the chamber with a degree of freedom aligned radially with the chamber.

Example A4. The apparatus of example A3, wherein the first transducer is located at least partially around the chamber, wherein the first transducer is configured to oscillate a longitudinal wall of the chamber.

Example A5. The apparatus of any preceding example, wherein the first transducer is configured to sense acoustic pressures in the chamber.

Example A6. The apparatus of any preceding example, wherein the second transducer is configured linearly with respect to the chamber with a degree of freedom aligned with a longitudinal axis of the chamber.

Example A7. The apparatus of example A6, wherein the second transducer is located near an end of the chamber, wherein the second transducer is configured to transmit oscillations between the target material and the second transducer by oscillating an end wall of the chamber.

Example A8. The apparatus of example A7, wherein the apparatus comprises a flexible membrane near the end wall of the chamber, the flexible membrane being configured to transmit oscillations between the target material and the second transducer.

Example A9. The apparatus of any preceding example, wherein the second transducer is configured coaxially with the chamber with a degree of freedom aligned radially with the chamber.

Example A10. The apparatus of any preceding example, wherein the second transducer is configured to generate acoustic pressures in the chamber.

Example A11. The apparatus of example A10, wherein the apparatus is configured to determine the delta acoustic pressure actuating capability of the first transducer and the second transducer.

Example A12. The apparatus of any preceding example, wherein the apparatus is configured to actively control acoustic pressures in the chamber.

Example A13. The apparatus of any preceding example, wherein the first transducer is a first piezoelectric element and/or the second transducer is a second piezoelectric element.

Example A14. The apparatus of any preceding example, wherein the chamber is a capillary.

Example A15. A radiation source comprising the apparatus according to any of examples A1-A14.

Example A16. A lithographic system comprising the radiation source according to example A15.

Example B1. A method of monitoring a stream of droplets of target material for generating a radiation beam in a radiation source, the method comprising:
 passing the target material through a chamber of a target material emitter before forming the stream of droplets,
 generating acoustic pressures in the chamber using an first transducer, and
 sensing the acoustic pressures in the chamber using a second transducer.

Example B2. The method of example B1, the method further comprises sensing the acoustic pressures by sensing voltage feedback caused by the forced acoustic displacement of the second transducer.

Example B3. The method of examples B1-B2, further comprising actively controlling acoustic pressures in the chamber.

Example B4. The method of examples B1-B3, wherein the first transducer is a first piezoelectric element and/or the second transducer is a second piezoelectric element.

Example C1. An apparatus for monitoring a stream of droplets of target material for generating a radiation beam in a radiation source, wherein the apparatus comprises:
 a target material emitter configured to create the stream of droplets of target material,
 wherein the target material emitter comprises a chamber configured for the target material to pass through before forming the stream of droplets, and
 a transducer;
 wherein the transducer comprises transducer material and a plurality of electrodes on the transducer material such that the transducer is configured to generate and sense the acoustic pressures in the chamber.

Example C2. The apparatus of example C1, wherein the transducer material is a piezoelectric element.

Example C3. The apparatus of example C1, wherein the electrodes are formed by notches in a conductive coating around the transducer material.

Other implementations are within the scope of the following claims.

The invention claimed is:
1. An apparatus for monitoring a stream of droplets of target material for generating a radiation beam in a radiation source, wherein the apparatus comprises:

a target material emitter configured to create the stream of droplets of target material,
wherein the target material emitter comprises a chamber configured for the target material to pass through;
a first transducer configured to generate acoustic pressures in the chamber and to sense acoustic pressures in the chamber, and
a second transducer configured to sense the acoustic pressures in the chamber.

2. The apparatus of claim 1, wherein the second transducer is configured to sense the acoustic pressures by measuring the voltage feedback caused by the forced acoustic displacement of the second transducer.

3. The apparatus of claim 2, wherein the chamber is a capillary.

4. The apparatus of claim 1, wherein the first transducer is configured coaxially with the chamber with a degree of freedom aligned radially with the chamber.

5. The apparatus of claim 4, wherein the first transducer is located at least partially around the chamber, wherein the first transducer is configured to oscillate a longitudinal wall of the chamber.

6. The apparatus of claim 1, wherein the second transducer is configured linearly with respect to the chamber with a degree of freedom aligned with a longitudinal axis of the chamber.

7. The apparatus of claim 1, wherein the second transducer is configured coaxially with the chamber with a degree of freedom aligned radially with the chamber.

8. The apparatus of claim 1, further comprising a control unit configured to actively control acoustic pressures in the chamber.

9. The apparatus of claim 1, wherein the first transducer is a first piezoelectric element and/or the second transducer is a second piezoelectric element.

10. A radiation source comprising the apparatus according to claim 1.

11. An apparatus for monitoring a stream of droplets of target material for generating a radiation beam in a radiation source, the apparatus comprising:
a target material emitter configured to create the stream of droplets of target material,
wherein the target material emitter comprises a chamber configured for the target material to pass through;
a first transducer configured to generate acoustic pressures in the chamber, and
a second transducer configured to sense the acoustic pressures in the chamber,
wherein the second transducer is configured linearly with respect to the chamber with a degree of freedom aligned with a longitudinal axis of the chamber.

12. The apparatus of claim 11, wherein the second transducer is located near an end of the chamber, wherein the second transducer is configured to transmit oscillations between the target material and the second transducer by oscillating an end wall of the chamber.

13. The apparatus of claim 12, wherein the apparatus comprises a flexible membrane near the end wall of the chamber, the flexible membrane being configured to transmit oscillations between the target material and the second transducer.

14. An apparatus for monitoring a stream of droplets of target material for generating a radiation beam in a radiation source, the apparatus comprising:
a target material emitter configured to create the stream of droplets of target material,
wherein the target material emitter comprises a chamber configured for the target material to pass through;
a first transducer configured to generate acoustic pressures in the chamber, and
a second transducer configured to sense the acoustic pressures in the chamber and to generate acoustic pressures in the chamber.

15. The apparatus of claim 14, further comprising a control unit configured to determine the delta acoustic pressure actuating capability of the first transducer and the second transducer.

16. A lithographic system comprising a radiation source and an apparatus for monitoring a stream of droplets of target material for generating a radiation beam in the radiation source, wherein the apparatus comprises:
a target material emitter configured to create the stream of droplets of target material,
wherein the target material emitter comprises a chamber configured for the target material to pass through;
a first transducer configured to generate acoustic pressures in the chamber and to sense acoustic pressures in the chamber, and
a second transducer configured to sense the acoustic pressures in the chamber.

17. A method of monitoring a stream of droplets of target material for generating a radiation beam in a radiation source, the method comprising:
passing the target material through a chamber of a target material emitter before forming the stream of droplets,
generating acoustic pressures in the chamber using a first transducer and a second transducer, and
sensing the acoustic pressures in the chamber using the first transducer and the second transducer.

18. The method of claim 17, further comprising sensing the acoustic pressures by sensing voltage feedback caused by the forced acoustic displacement of the first or the second transducer.

19. The method of claim 17, further comprising actively controlling acoustic pressures in the chamber.

20. The method of claim 19, wherein the first transducer is a first piezoelectric element and/or the second transducer is a second piezoelectric element.

21. An apparatus for monitoring a stream of droplets of target material for generating a radiation beam in a radiation source, wherein the apparatus comprises:
a target material emitter configured to create the stream of droplets of target material,
wherein the target material emitter comprises a chamber configured for the target material to pass through before forming the stream of droplets, and
a transducer;
wherein the transducer comprises transducer material and a plurality of electrodes on the transducer material such that the transducer is configured to generate and sense the acoustic pressures in the chamber.

22. The apparatus of claim 21, wherein the transducer material is a piezoelectric element.

23. The apparatus of claim 21, wherein the electrodes are formed by notches in a conductive coating around the transducer material.

24. The apparatus of claim 21, wherein the transducer is configured coaxially with the chamber.

25. The apparatus of claim 21, wherein the chamber is a capillary.

26. The apparatus of claim 21, wherein the transducer is configured to sense the acoustic pressures by measuring the voltage feedback caused by the forced acoustic displacement of the transducer.

* * * * *